United States Patent
Teramoto et al.

(10) Patent No.: US 8,422,327 B2
(45) Date of Patent: Apr. 16, 2013

(54) SEMICONDUCTOR DEVICE HAVING NONVOLATILE MEMORY ELEMENT AND MANUFACTURING METHOD THEREOF

(75) Inventors: Kazuhiro Teramoto, Tokyo (JP); Hiroki Fujisawa, Tokyo (JP); Susumu Takahashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 339 days.

(21) Appl. No.: 12/801,124

(22) Filed: May 24, 2010

(65) Prior Publication Data

US 2010/0302833 A1 Dec. 2, 2010

(30) Foreign Application Priority Data

May 29, 2009 (JP) ................................. 2009-131174

(51) Int. Cl.
G11C 17/18 (2006.01)
(52) U.S. Cl.
USPC ...... 365/225.7; 365/96; 365/200; 365/230.06
(58) Field of Classification Search ............... 365/225.7, 365/96, 200, 230.06
See application file for complete search history.

(56) References Cited

U.S. PATENT DOCUMENTS

| | | | | | |
|---|---|---|---|---|---|
| 5,028,821 | A | * | 7/1991 | Kaplinsky | 326/41 |
| 5,402,014 | A | * | 3/1995 | Ziklik et al. | 326/37 |
| 5,508,637 | A | * | 4/1996 | Mehendale | 326/38 |
| 5,923,672 | A | * | 7/1999 | Roberts et al. | 714/710 |
| 5,929,691 | A | | 7/1999 | Kim et al. | |
| 5,966,339 | A | * | 10/1999 | Hsu et al. | 365/225.7 |
| 6,043,676 | A | * | 3/2000 | Mendel et al. | 326/39 |
| 6,480,428 | B2 | * | 11/2002 | Zheng et al. | 365/200 |
| 6,856,569 | B2 | * | 2/2005 | Nelson et al. | 365/225.7 |
| 6,906,969 | B2 | * | 6/2005 | Roehr et al. | 365/200 |
| 6,987,690 | B2 | * | 1/2006 | Hidaka | 365/161 |
| 7,274,615 | B2 | * | 9/2007 | Nakagawa et al. | 365/225.7 |
| 7,317,651 | B2 | * | 1/2008 | Kim et al. | 365/225.7 |
| 7,362,159 | B2 | | 4/2008 | Fukuda | |
| 7,362,628 | B2 | * | 4/2008 | Takenaka | 365/200 |
| 7,489,180 | B2 | * | 2/2009 | Marshall | 327/525 |
| 7,492,623 | B2 | * | 2/2009 | Lee | 365/96 |
| 7,567,114 | B2 | | 7/2009 | Matsubara | |
| 7,626,870 | B2 | * | 12/2009 | Vollrath | 365/189.011 |
| 2004/0148329 | A1 | | 7/2004 | Ogasawara et al. | |
| 2006/0114052 | A1 | | 6/2006 | Fukuda | |
| 2007/0091662 | A1 | | 4/2007 | Matsubara | |
| 2008/0180983 | A1 | * | 7/2008 | Vollrath | 365/96 |
| 2009/0157856 | A1 | | 6/2009 | Ogasawara et al. | |

FOREIGN PATENT DOCUMENTS

| | | |
|---|---|---|
| JP | 10-75170 A | 3/1998 |
| JP | 2004-227361 A | 8/2004 |
| JP | 2006-147651 A | 6/2006 |
| JP | 2007-116045 A | 5/2007 |

\* cited by examiner

*Primary Examiner* — Viet Q Nguyen
(74) *Attorney, Agent, or Firm* — McGinn IP Law Group, PLLC (57) ABSTRACT

To provide a semiconductor device including a pair of antifuse elements at either a high level or a low level, an OR circuit that outputs different logic information for a case that at least one of the antifuse elements is at a high level and a case that both of the antifuse elements are at a low level, and an exclusive OR circuit that outputs different logic information for a case that the logic states are different from each other and a case that they are same as each other.

18 Claims, 10 Drawing Sheets

SEMICONDUCTOR DEVICE HAVING NONVOLATILE MEMORY ELEMENT AND MANUFACTURING METHOD THEREOF

BACKGROUND OF THE INVENTION

1. Field of the Invention

The present invention relates to a semiconductor device and a manufacturing method thereof, and more particularly relates to a semiconductor device that stores a defective address in a nonvolatile memory element and a manufacturing method of the semiconductor device.

2. Description of Related Art

While storage capacity of semiconductor memory devices represented by DRAM (Dynamic Random Access Memory) is increasing every year due to the progress of downscaling technique, the reality is that the number of defective memory cells included in a chip is also increasing as chips are further downscaled. Such defective memory cells are usually replaced by redundant memory cells, and thus defective addresses can be relieved.

Fuse elements are used to store defective addresses (see Japanese Patent Application Laid-open Nos. H10-75170 and 2006-147651). Fuse elements in an initial state are electrically conductive and can store a defective address in a nonvolatile manner by laser beam irradiation that disconnects the conduction. Therefore, a desired address can be stored by providing a plurality of such fuse elements and disconnecting a desired one of the fuse elements. That is, the fuse element is a device that stores information in a nonvolatile manner by turning its conductive state to an insulating state.

However, defective bits may also be generated sporadically after an address replacement described above is performed, due to heat stress during packaging or the like. When such defective bits are found after packaging, the packaged item needs to be handled as a defective product, because the address replacement by laser beam irradiation can no longer be performed.

To solve the above problem, there has been proposed a method of providing a relief circuit that can relieve a small number of defective bits found after packaging. In this case, electrically-writable nonvolatile memory elements are used for a circuit that stores defective addresses, instead of fuse elements that require laser beam irradiation. A so-called "anti fuse element" that uses dielectric breakdown of an oxide film has been known as such memory elements (see Japanese Patent Application Laid-open Nos. 2004-227361 and 2007-116045).

Contrary to the fuse element, the antifuse element is a device that stores information by turning its insulating state to a conductive state. A defective address is written in the antifuse element by dielectric breakdown caused by application of a high voltage. Therefore, unlike the fuse element, laser beam irradiation is unnecessary when writing. Accordingly, the defective address can be written at a high speed without requiring a device such as a laser trimmer. Furthermore, its product reliability can be improved because problems such as breakage of passivation films by laser beam irradiation are not caused.

Meanwhile, antifuse elements have a problem of time degradation. That is, if dielectric breakdown is insufficient when changing an antifuse element from an insulating state to a conductive state, resistance of the element rises over time and the conductive state returns to the insulating state. Therefore, there has been recently proposed a technique of using a pair of antifuse elements for storing one-bit information (see Japanese Patent Application Laid-open No. 2007-116045). In this technique, a pair of antifuse elements is connected in parallel such that stored information is not lost even when one of the antifuse elements returns to an insulating state, because a conductive state is maintained by the other antifuse element.

Among antifuse elements, there can be a defective product that cannot be turned to a conductive state even when a high voltage is applied. Such a defective product is detected by performing a test in which, after writing a defective address, reading is performed by a method similar to a normal reading method and then whether a correct defective address has been read is verified.

However, with a pair of antifuse elements having one-bit information stored therein as described in Japanese Patent Application Laid-open No. 2007-116045, when only one of the antifuse elements is defective and the other one is not defective, the test mentioned above cannot detect the pair as a defective product. That is, because correct information is read as long as one of the pair of antifuse elements is in a conductive state, the pair cannot be detected as a defective product even when the other antifuse element is not in a conductive state.

As described above, the object of storing one-bit information in a pair of antifuse elements is to reduce the time degradation risk. To achieve this object, both of the two antifuse elements have to function normally at least at the time of production. Therefore, it is desired that even when only one of the antifuse elements is defective, the pair of antifuse elements can be detected as a defective product in a test after writing.

SUMMARY

In one embodiment, there is provided a semiconductor device comprising: a pair of nonvolatile memory elements respectively being in either a first logic state or a second logic state; a first logic circuit that outputs different logic information for a case that at least one of the pair of nonvolatile memory elements is in the first logic state and a case that both of the pair of nonvolatile memory elements are in the second logic state; and a second logic circuit that outputs different logic information for a case that the logic states of the pair of nonvolatile memory elements are different from each other and a case that the logic states of the pair of nonvolatile memory elements are same as each other.

In another embodiment, there is provided manufacturing method of a semiconductor device that includes a pair of nonvolatile memory elements respectively being in either a first logic state or a second logic state, the method comprising: writing a same logic state in the pair of nonvolatile memory elements; and determining whether logic states of the pair of nonvolatile memory elements match after writing by the writing.

According to the present invention, in a semiconductor device that stores a one-bit defective address in a pair of anti fuse elements, even when only one of the anti fuse elements is defective, the pair can be detected as a defective product.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Preferred embodiments of the present invention will now be explained in detail with reference to the drawings.

Figure 1:
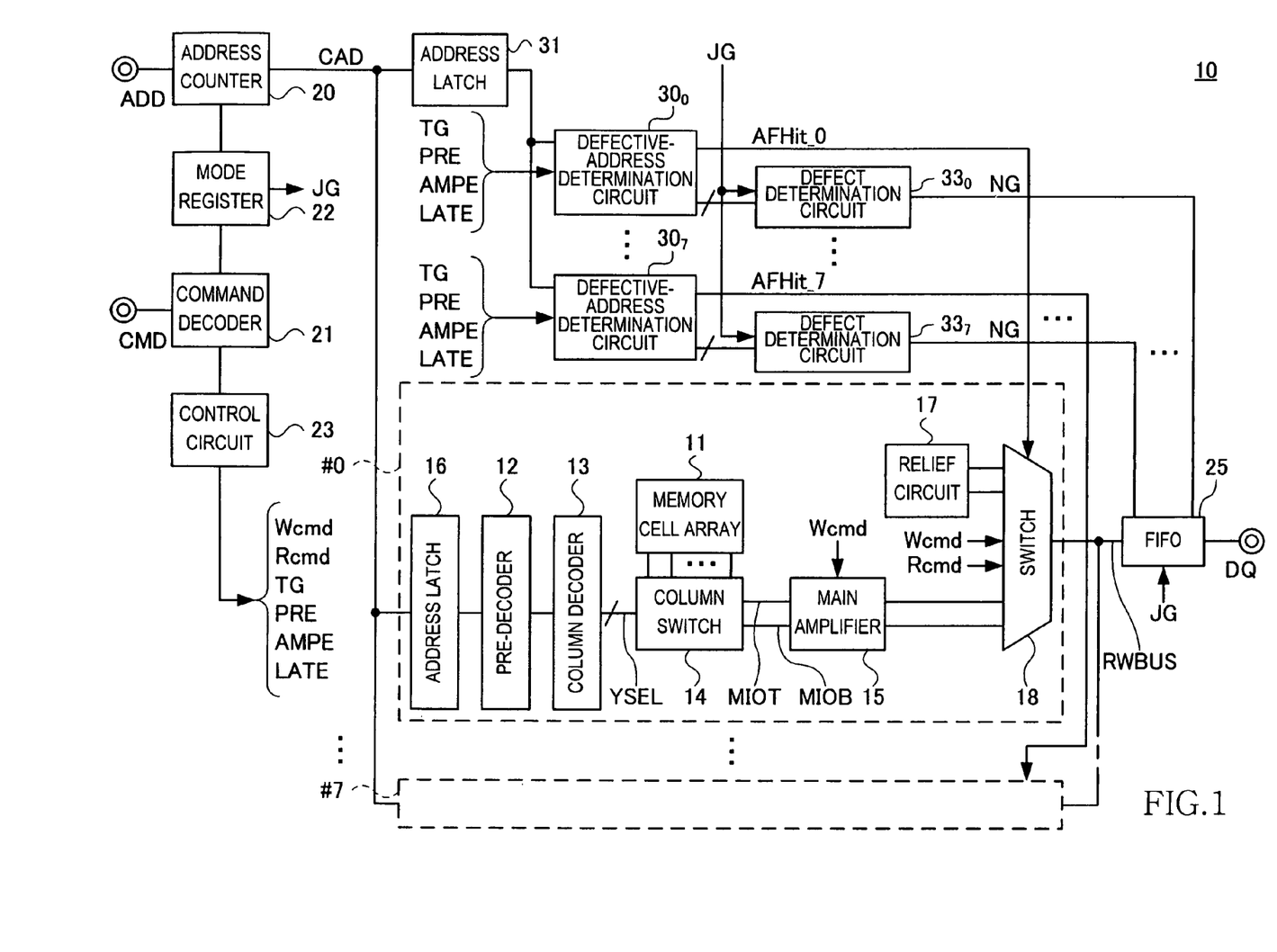
FIG. 1 is a block diagram showing a configuration of main parts of a semiconductor device according to an embodiment of the present invention.

FIG. 1 is a block diagram showing a configuration of main parts of a semiconductor device 10 according to an embodiment of the present invention. In FIG. 1, only column system circuits and data system circuits are shown, whereas row circuits are omitted. Although not limited thereto, it is assumed in the following descriptions that the semiconductor device 10 is a DRAM.

As shown in FIG. 1, the semiconductor device 10 includes banks #0 to #7, an address counter 20, a command decoder 21, a mode register 22, a control circuit 23, an FIFO circuit 25, defective-address determination circuits $30_0$ to $30_7$, an address latch 31, and defect determination circuits $33_0$ to $33_7$. In the present embodiment, the defective-address determination circuits $30_0$ to $30_7$ and the defect determination circuits $33_0$ to $33_7$ are respectively provided one for each of the banks #0 to #7. That is, the semiconductor device 10 is configured such that one defective address for each of the banks #0 to #7 can be replaced.

The banks #0 to #7 have a configuration identical to each other. To explain the configuration as focusing on the bank #0, as shown in FIG. 1, the bank #0 includes a memory cell array 11, a pre-decoder 12, a column decoder 13, a column switch 14, a main amplifier 15, an address latch 16, a relief circuit 17, and a switch 18.

Figure 2:
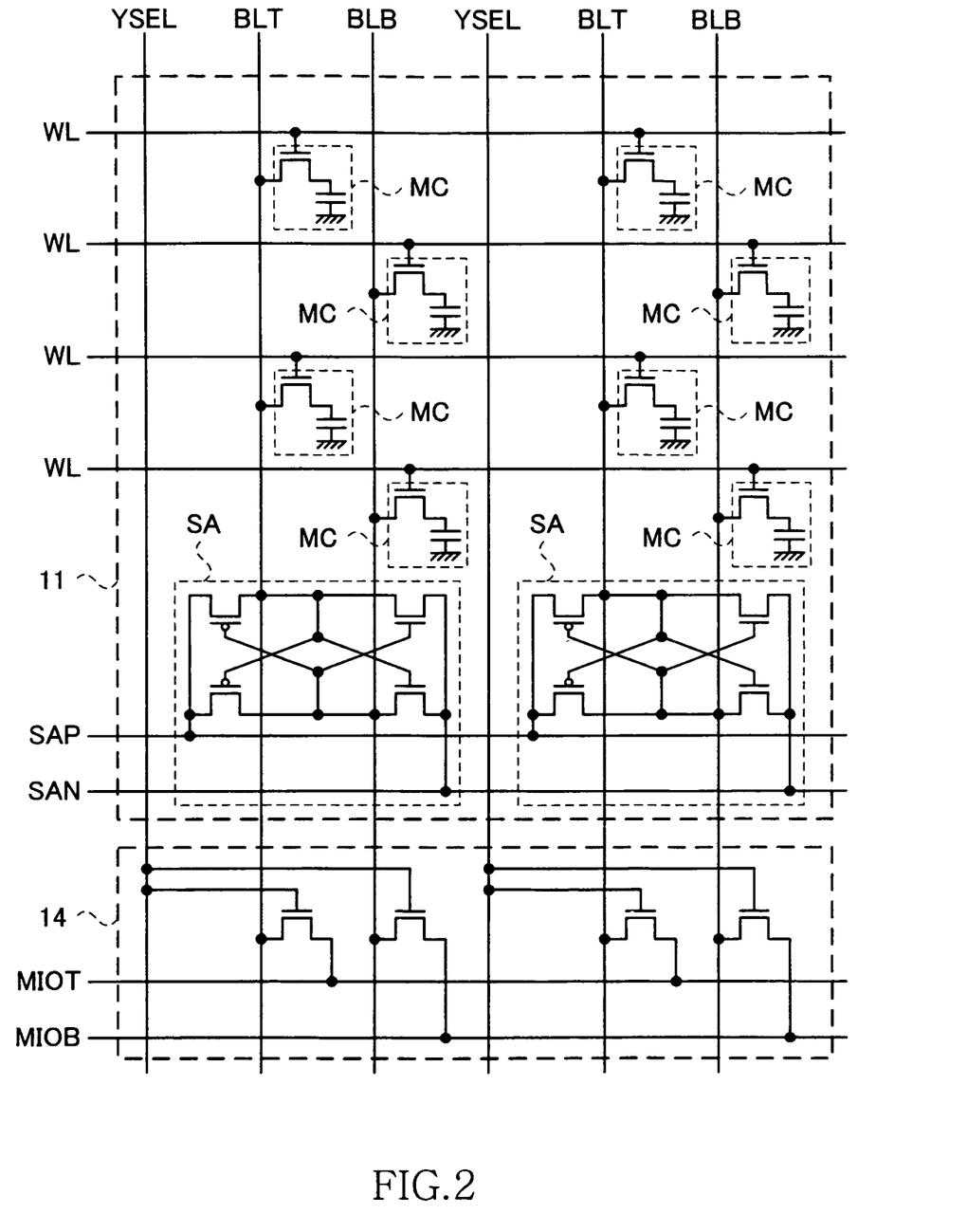
FIG. 2 is a pattern diagram indicating a structure of a memory cell array and a column switch according to an embodiment of the present invention.

As shown in FIG. 2, the memory cell array 11 is configured to include plural word lines WL, plural bit line pairs BLT and BLB, plural memory cells MC provided at intersections of these lines, and plural sense amplifiers SA provided for each of the bit line pairs BLT and BLB, with each of the memory cell MC having a DRAM cell configuration. While the memory cell array 11 includes a redundant circuit for performing an address replacement in a selection test performed in a wafer state, the redundant circuit is not shown in the drawings because it is not directly relevant to the present invention.

The pre-decoder 12 and the column decoder 13 are connected to an address terminal ADD via the address counter 20 and the address latch 16, and when a column address CAD is input from the address terminal ADD, activate one of column selection lines YSEL corresponding to the input column address CAD.

As shown in FIG. 2, the column switch 14 includes a pair of transfer gates for each of the column selection lines YSEL and each of the transfer gates is connected between the bit line pair BLT and BLB and a main IO line pair MIOT and MIOB. When one of the column selection lines YSEL is activated by the column decoder 13, a transfer gate having a control electrode connected to the column selection line YSEL is turned ON, and thus corresponding one of the bit line pairs BLT and BLB is connected to the main IO line pair MIOT and MIOB. While the bit line pair BLT and BLB is shown as directly connecting to the main IO line pair MIOT and MIOB for simplicity in FIG. 2, IO lines are hierarchized in an actual DRAM, with a local IO line pair LIOT and LIOB (not shown) or the like intervening between the bit line and the main IO line.

The main amplifier 15 is provided between the main IO line pair MIOT and MIOB and a read/write bus RWBUS, and includes a read amplifier and a write buffer as described below. The read/write bus RWBUS is connected to a data input/output terminal DQ via the FIFO circuit 25. With this configuration, data input or output via the data input/output terminal DQ is performed.

The relief circuit 17 is a circuit that relieves a defective address (an address corresponding to bits that cannot be accessed or stored) in the memory cell array 11. When there is a read request from a defective address, the switch 18 changes the connection destination of the read/write bus RWBUS from the memory cell array 11 to the relief circuit 17, and, when there is a write request in a defective address, connects the read/write bus RWBUS to the relief circuit 17. The relief circuit 17 and the switch 18 are explained below in detail.

Figure 3:
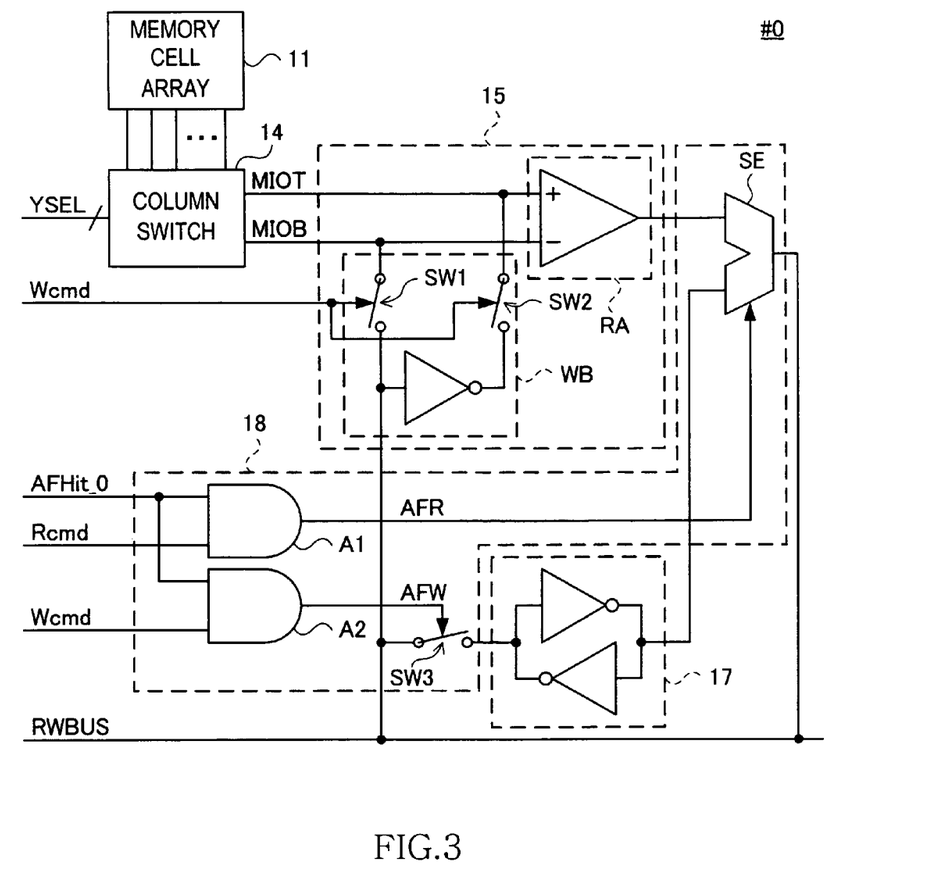
FIG. 3 is a circuit diagram of a main amplifier, a relief circuit, and a switch in a bank according to an embodiment of the present invention.

FIG. 3 is a circuit diagram of the main amplifier 15, the relief circuit 17, and the switch 18 in the bank #0. As shown in FIG. 3, the main amplifier 15 includes a read amplifier RA that converts a complementary signal appearing in the main IO line pair MIOT and MIOB to a single signal of a high level or a low level and supplies the signal to the read/write bus RWBUS, and a write buffer WB that supplies a single signal appearing in the read/write bus RWBUS to the main IO line pair MIOT and MIOB in a form of a complementary signal. The write buffer WB includes switches SW1 and SW2, and the switches SW1 and SW2 become conductive when a write command Wcmd is input thereto from the control circuit 23.

The relief circuit 17 is configured as a flip-flop circuit, that is, an SRAM cell. That is, the relief circuit 17 is a memory element of a type different from the memory cell MC in the memory cell array 11.

The switch 18 includes a switch SW3, a selector SE, and AND circuits A1 and A2. One end of the switch SW3 is connected to a line connecting the read/write bus RWBUS and the write buffer WB, whereas the other end is connected to one end of the relief circuit 17. The selector SE has two input ends, one of which connected to an output end of the read amplifier RA and the other connected to the end of the relief circuit 17. An output end of the selector SE is connected to the read/write bus RWBUS.

A hit signal AFHit_0 is input to the AND circuits A1 and A2 from the corresponding defective-address determination circuit $30_0$. In summary, the hit signal AFHit_0, which is explained below in detail, is activated when an address supplied from the address terminal ADD is stored in the defective-address determination circuit $30_0$ (when an, address to be accessed is a defective address).

A read command Rcmd is also input to the AND circuit A1 from the control circuit 23, and a redundant read signal AFR becomes an active state when both of the read command Rcmd and the hit signal AFHit_0 are activated. The redundant read signal AFR is input to the selector SE, and the selector SE connects the relief circuit 17 and the read/write bus RWBUS and disconnects the read amplifier RA and the read/write bus RWBUS when the redundant read signal AFR is activated. On the other hand, the selector SE connects the read amplifier RA and the read/write bus RWBUS and disconnects the relief circuit 17 and the read/write bus RWBUS when the redundant read signal AFR is not activated. The connection destination of the read/write bus RWBUS is thereby changed from the memory cell array 11 to the relief circuit 17 when there is a read request from a defective address.

The write command Wcmd is also input to the AND circuit A2 from the control circuit 23, and a redundant write signal AFW becomes an active state when both of the write command Wcmd and the hit signal AFHit_0 are activated. The redundant write signal AFW is input to the switch SW3, and the switch SW3 connects the relief circuit 17 and the read/write bus RWBUS when the redundant write signal AFW is activated. On the other hand, the switch SW3 disconnects the relief circuit 17 and the read/write bus RWBUS when the redundant write signal AFW is not activated. The read/write bus RWBUS is thereby connected to the relief circuit 17 when there is a write request in a defective address.

Referring back to FIG. 1, the defective-address determination circuits $30_0$ to $30_7$ respectively store a defective address in corresponding one of the banks #0 to #7. Each of the defective-address determination circuits $30_0$ to $30_7$ is configured such that it can store an address for only one memory cell MC, and when there are defective addresses exceeding one memory cell MC in a single bank, the semiconductor device 10 is discarded because it cannot be relieved. However, it is needless to say that plural defective addresses can be relieved by providing two or more defective-address determination circuits for each bank.

Figure 4:
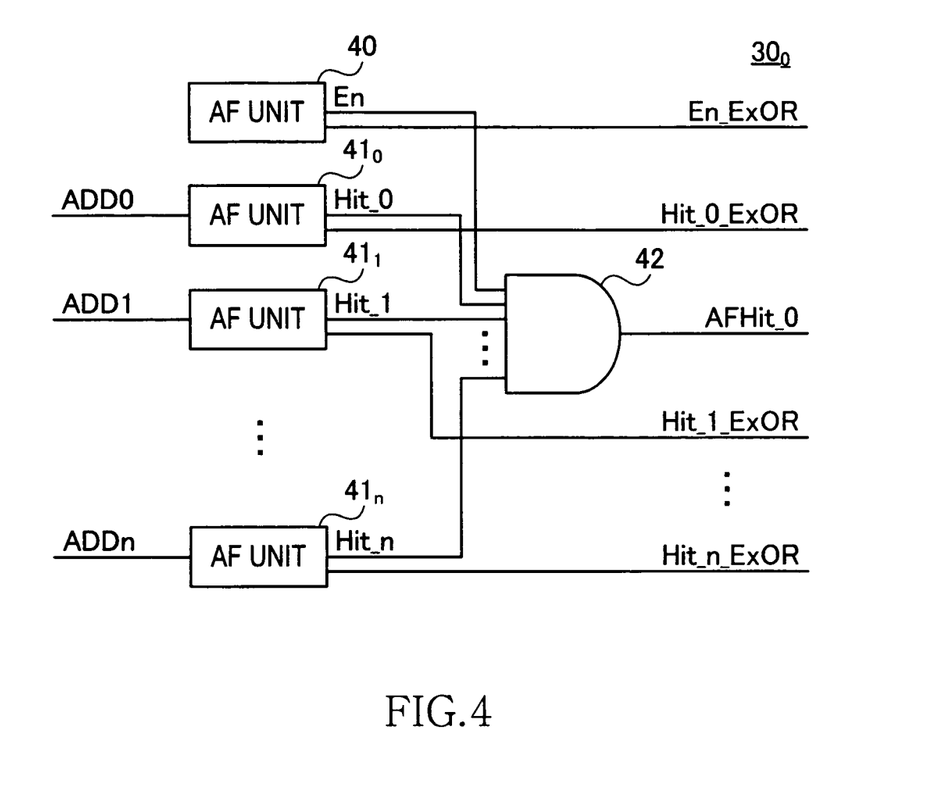
FIG. 4 is a circuit diagram of a defective-address determination circuit according to an embodiment of the present invention.

FIG. 4 is a circuit diagram of the defective-address determination circuit $30_0$. While descriptions are provided here as focusing on the defective-address determination circuit $30_0$, the defective-address determination circuits $30_1$ to $30_7$ can be configured in a similar manner.

As shown in FIG. 4, the defective-address determination circuit $30_0$ includes plural antifuse (AF) units 40 and $41_0$ to $41_n$, and an AND circuit 42. A number n+1 of the antifuse units $41_0$ to $41_n$ is equal to the number of bits of the column address CAD, and bits ADD0 to ADDn of the column address CAD are respectively input to the antifuse units $41_0$ to $41_n$.

Each of the antifuse units 40 and $41_0$ to $41_n$ includes a pair of antifuse elements and one-bit information is stored in the pair of antifuse elements.

Figure 5:
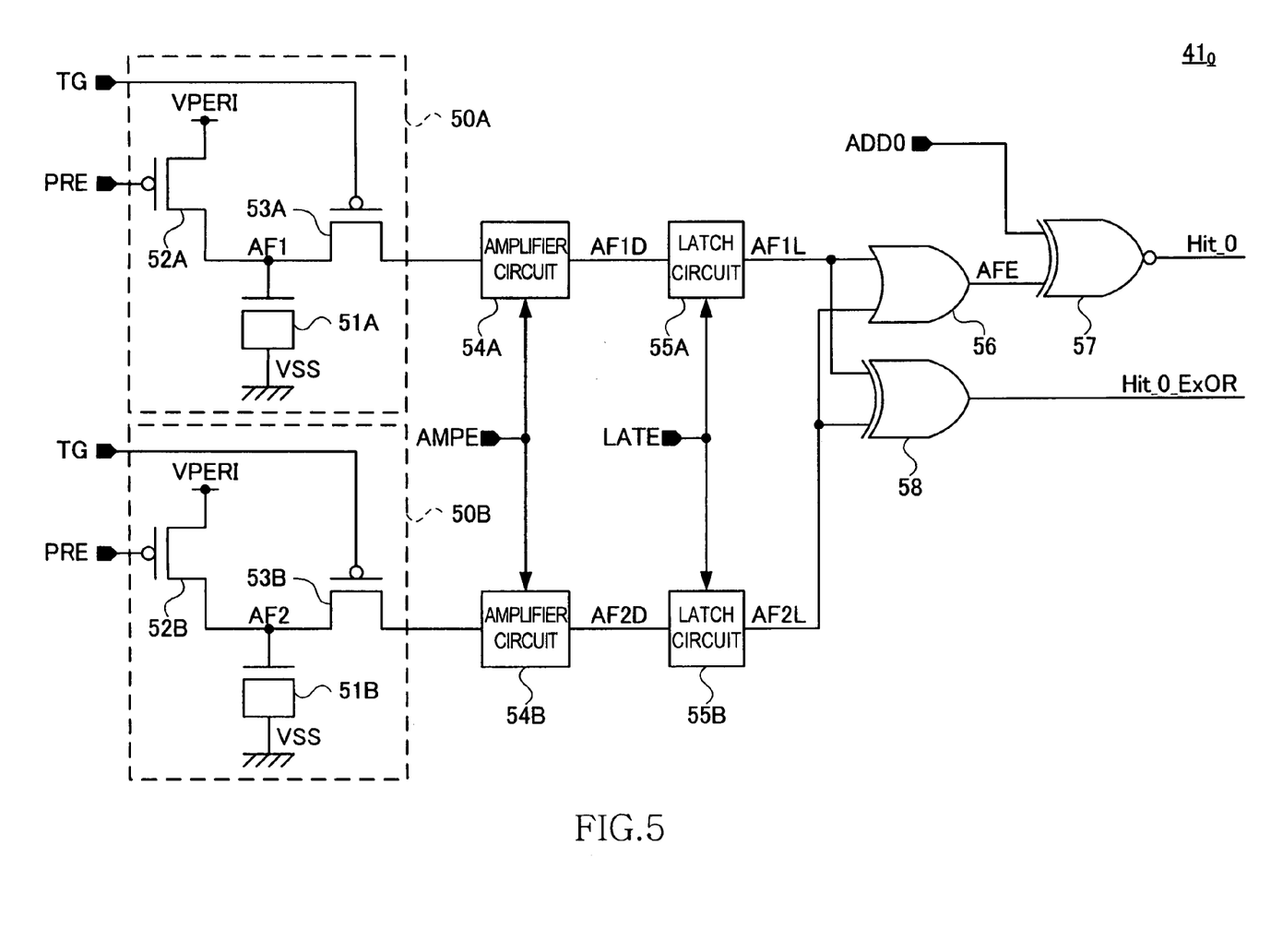
FIG. 5 is a circuit diagram of an antifuse unit according to an embodiment of the present invention.

FIG. 5 is a circuit diagram of the antifuse unit $41_0$. While descriptions are provided here as focusing on the antifuse unit $41_0$, the antifuse units $41_1$ to $41_n$ can be configured in a similar manner.

As shown in FIG. 5, the antifuse unit $41_0$ has a pair of antifuse blocks 50A and 50B each having antifuse elements 51A and 51B respectively, amplifier circuits 54A and 54B, latch circuits 55A and 55B, an OR circuit 56 (corresponds to first logic circuit in the claims), an exclusive NOR circuit 57, and an exclusive OR circuit 58 (corresponds to second logic circuit in the claims).

The antifuse block 50A further includes P-channel MOS transistors 52A and 53A. Similarly, the antifuse block 50B includes P-channel MOS transistors 52B and 53B. A power-source voltage VPERI is supplied to the sources of the transistors 52A and 52B, whose drains being connected to the sources of corresponding ones of the transistors 53A and 53B. A control signal PRE is supplied to gates of the transistors 52A and 52B from the control circuit 23, and a control signal TG is supplied to gates of the transistors 53A and 53B from the control circuit 23, respectively. Outputs of the antifuse blocks 50A and 50B are retrieved from drains of the transistors 53A and 53B. While a high voltage application circuit for disconnecting antifuses is provided in the antifuse blocks 50A and 50B, it is not shown in FIG. 5.

The antifuse elements 51A and 51B have a configuration of an N-channel MOS transistor whose source and drain are short-circuited as shown in FIG. 5. Gates of the antifuse elements 51A and 51B are connected to the drains of corresponding ones of the transistors 52A and 52B, and their source/drain has a ground potential VSS supplied thereto.

The antifuse elements 51A and 51B respectively have their gates and sources/drains insulated via a gate insulating film at an initial state, and thus no current flows therebetween. However, dielectric breakdown occurs in the gate insulating film when a high voltage is applied between the gate and the source/drain, and thus a current path is formed therebetween. Once the insulating film is broken by dielectric breakdown, it is not possible to intentionally restore the broken film, and thus irreversible and nonvolatile writing can be made. However, as described above, there is a problem of time degradation of the anti fuse element. Therefore, when the dielectric breakdown is insufficient, the antifuse element may have a high resistance and return to an insulating state over time. On the other hand, the antifuse units $41_0$ stores one-bit information by the pair of antifuse elements 51A and 51B, and thus even when one of the antifuse elements returns to an insulating state due to time degradation, the other antifuse element maintains the stored content.

An operation of the antifuse region $41_0$ at the time of reading information stored in the antifuse element pair 51A and 51B is explained below.

Figure 6:
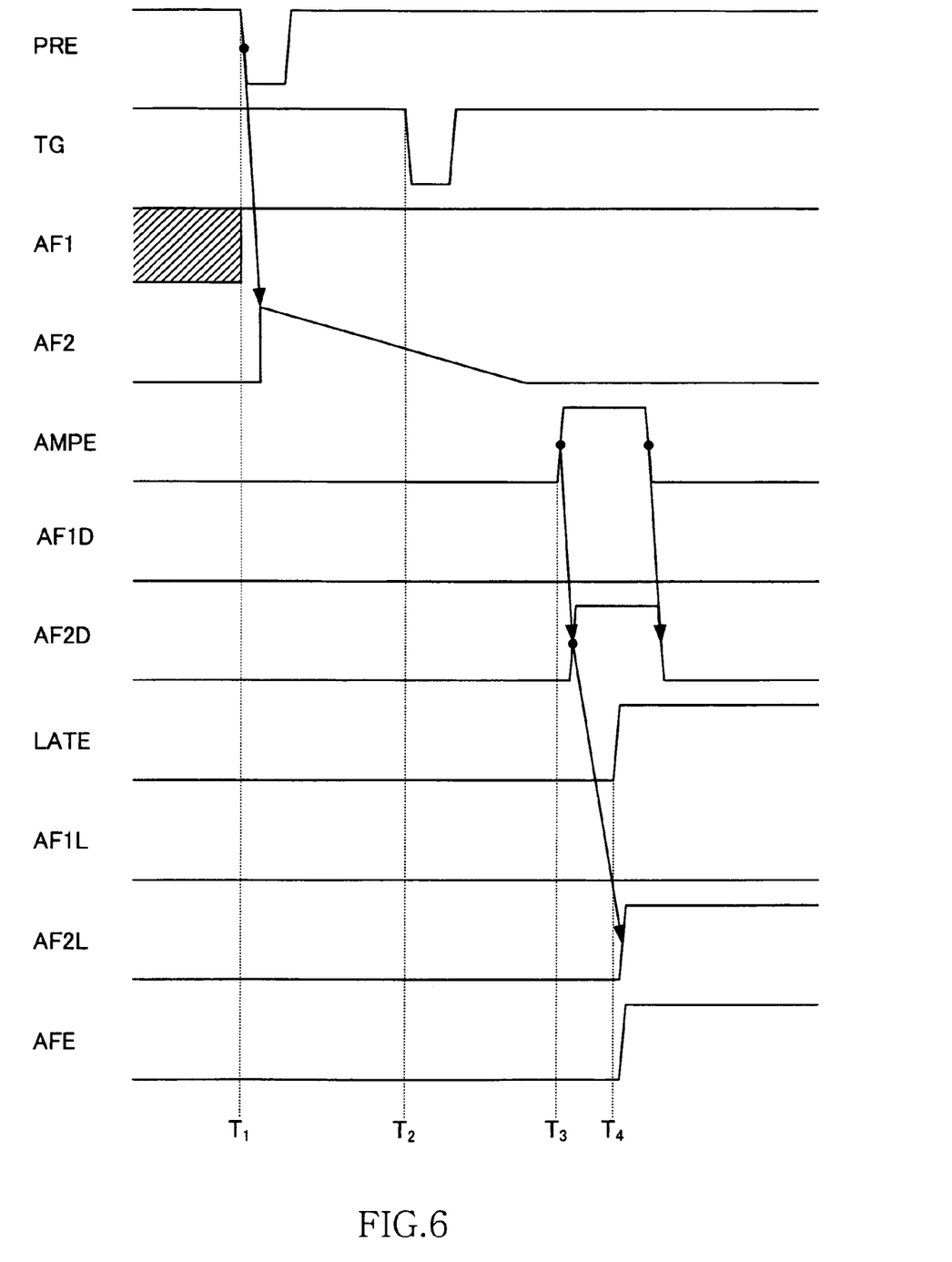
FIG. 6 is a signal timing chart at the time of reading information stored in an antifuse element pair according to an embodiment of the present invention.

FIG. 6 is a signal timing chart at the time of reading information stored in the antifuse element pair 51A and 51B. Reference characters AF1, AF2 or the like shown in FIG. 6 indicate the potential of the parts corresponding to like reference characters shown in FIG. 5. FIG. 6 is shown assuming the following state. That is, both of the antifuse elements 51A and 51B have their insulation broken once where the antifuse element 51B maintains a conductive state, but the antifuse element 51A has returned to an insulating state due to time degradation.

First, as shown in FIG. 6, the control signal PRE is activated for a predetermined period of time from a time $T_1$. The transistors 52A and 52B are turned ON while the control signal PRE is active, and gate potentials AF1 and AF2 of the antifuse elements 51A and 51B become a high level as shown in FIG. 6. While the gate potential AF1 is maintained at a high level after the control signal PRE returned to an inactive state because the antifuse element 51A is in an insulating state, a current flows toward the grounded end through the antifuse element 51B because the antifuse element 51B is in a conductive state, and thus the gate potential AF2 falls and returns to a low level after a certain period of time.

After a predetermined period of time has elapsed since the control signal PRE is returned to an inactive state, the control signal TG is subsequently activated from a time $T_2$ for a predetermined period of time. While the control signal TG is active, the transistors 53A and 53B are turned ON, and the gate potentials AF1 and AF2 are supplied to the amplifier circuits 54A and 54B.

After a predetermined period of time has elapsed since the control signal TG is returned to an inactive state, a signal AMPE is then activated from a time $T_3$ for a predetermined period of time. The amplifier circuits 54A and 54B have a function of outputting a low level when the signal AMPE is inactive, amplifying the gate potentials AF1 and AF2 to a level required by the latch circuits 55A and 55B at a later stage, and outputting the gate potentials AF1 and AF2 in a reversed manner while the signal AMPE is active. With this configuration, as shown in FIG. 6, an output potential AF1D of the amplifier circuit 54A is maintained at a low level while the signal AMPE is active, whereas an output potential AF2D of the amplifier circuit 54B is at a high level while the signal AMPE is active.

Next, a signal LATE is activated at a time $T_4$ while the signal AMPE is active, and the active state is maintained. The latch circuits 55A and 55B have a function of latching the output potential AF1D, AF2D, respectively when the signal LATE is activated and outputting them as the output potentials AF1L and AF2L, respectively. Accordingly, as shown in FIG. 6, the output potentials AF1L and AF2L respectively become a low level and a high level after the time $T_4$.

A potential AFE is an output potential of the OR circuit 56. Because the OR circuit 56 raises the output potential AFE to a high level when either one of the output potentials AF1L or AF2L is at a high level, the output potential AFE after the time $T_4$ becomes a high level. That is, because the antifuse element 51B is in a conductive state, the output potential AFE is at a high level regardless of the state of the antifuse element 51A. This means that the contents stored in the antifuse element pair 51A and 51B are maintained even though the antifuse element 51A has returned to an insulating state.

Referring back to FIG. 5, the output potential AFE and the bit ADD0 corresponding to the column address CAD are supplied to the exclusive NOR circuit 57. Therefore, an output signal Hit_0 rises to a high level when the states of both of the output potential AFE and the bit ADD0 match, whereas the output signal Hit_0 falls to a low level when they do not match.

Referring back to FIG. 4, as described above, the bits ADD0 to ADDn of the column address CAD are respectively supplied to the antifuse units $41_0$ to $41_n$. According to the configuration described above, each of the antifuse units $41_0$ to $41_n$ raises corresponding one of the output signals Hit_0 to Hit_n to a high level when the one-bit information stored in the antifuse elements 51A and 51B matches the supplied bits ADD0 to ADDn. When they do not match, the corresponding output signals Hit_0 to Hit_n are lowered to a low level.

Bit information of the column address CAD is not supplied to the antifuse unit 40. The antifuse unit 40 is a circuit that raises an output signal En to a high level when the defective-address determination circuit $30_0$ is enabled and lowers the output signal En to a low level when it is not enabled. Specifically, The antifuse unit 40 has a configuration such that the exclusive NOR circuit 57 is deleted from the circuit diagram of the antifuse unit $41_0$ described with reference to FIG. 5, and the output potential AFE is replaced by the output signal En, where insulation of both of the antifuse elements 51A and 51B is broken when the defective-address determination circuit $30_0$ is enabled.

The AND circuit 42 has the output signals En and Hit_0 to Hit_n supplied thereto, and when all of these output signals are at a high level, activates the hit signal AFHit_0. That is, the AND circuit 42 activates the hit signal AFHit_0 when the defective-address determination circuit $30_0$ is enabled and all of the bits of the column address CAD match the stored information, and deactivates the hit signal AFHit_0 if this is not the case. The hit signal AFHit_0 thereby indicates whether the supplied column address CAD is a defective address. The hit signal AFHit_0 is supplied to the switch 18 (FIG. 1) as described above, and is used to determine whether to connect the relief circuit 17 to the read/write bus RWBUS.

An explanation is given of a configuration in which even when only one of the pair of antifuse elements 51A and 51B that store one-bit information is defective, the pair can be detected as a defective product.

The defect determination circuits $33_0$ to $33_7$ shown in FIG. 1 are circuits that respectively determine whether the defective-address determination circuits $30_0$ to $30_7$ are non-defective or defective. A case that the defective-address determination circuits $30_0$ to $30_7$ are defective means a state where pieces of the information stored in the pair of antifuse elements 51A and 51B that stores one-bit information do not match. While descriptions are provided here as focusing on the defective-address determination circuit $30_0$ and the defect determination circuit $33_0$, other circuits can be configured in a similar manner.

First, referring back to FIG. 5, output potentials AF1L and AF2L of the latch circuits 55A and 55B are input to the exclusive OR circuit 58 of the antifuse unit $41_0$. Therefore, an output signal Hit_0_ExOR of the exclusive OR circuit 58 becomes a low level when the output potentials AF1L and AF2L match, and becomes a high level when they do not match.

The antifuse units 40 and $41_1$ to $41_n$ included in the defective-address determination circuit $30_0$ other than the antifuse unit $41_0$ similarly include the exclusive OR circuit 58, and, as shown in FIG. 4, respectively output signals En_ExOR and Hit_1_ExOR to Hit_n_ExOR that are deactivated when the output potentials AF1L and AF2L match and are activated when they do not match. The signals En_ExOR and Hit_0_ExOR to Hit_n_ExOR that are output as described above are supplied to the defect determination circuit $33_0$.

Figure 7:
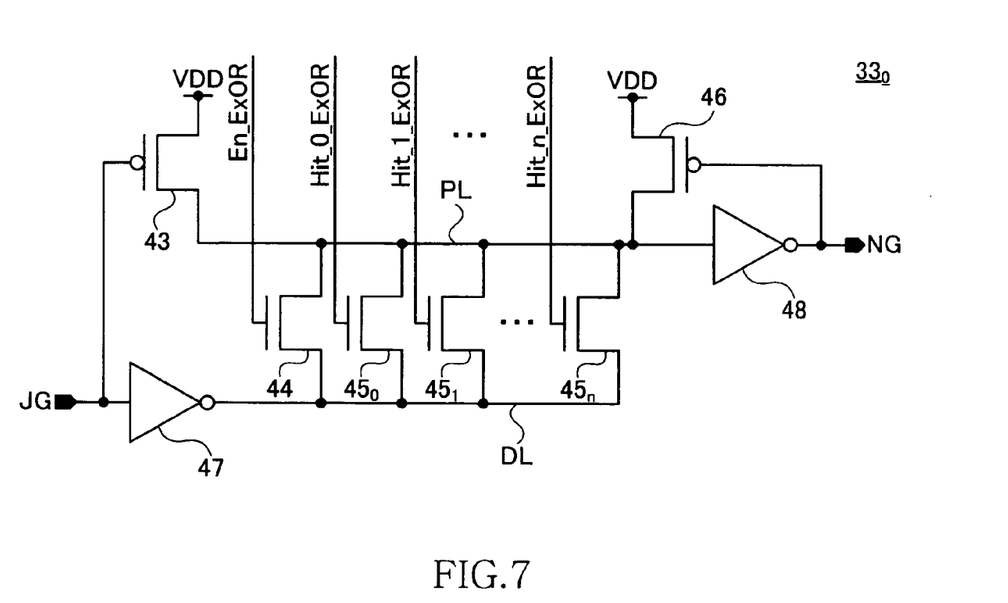
FIG. 7 is a circuit diagram of the defect determination circuit according to an embodiment of the present invention.

FIG. 7 is a circuit diagram of the defect determination circuit $33_0$. As shown in FIG. 7, the defect determination circuit $33_0$ has a configuration such that N-channel MOS transistors 44 and $45_0$ to $45_n$ are connected in parallel between a precharge line PL and a discharge line DL. The precharge line PL is precharged via a precharge transistor 43 when a test signal JG becomes a low level. The discharge line DL is discharged by an inverter 47 when the test signal JG becomes a high level. Gates of the transistors 44 and $45_0$ to $45_n$ respectively have the signals En_ExOR and Hit_0_Ex_OR to Hit_n_ExOR supplied thereto. Therefore, if at least one of these signals is at a high level, the precharge line PL and the discharge line DL are short-circuited. On the other hand, when all of the signals are at a low level, the precharge line PL and the discharge line DL are disconnected.

An operation of the defect determination circuit $33_0$ is explained below in detail with reference to a signal timing chart.

Figure 8A:
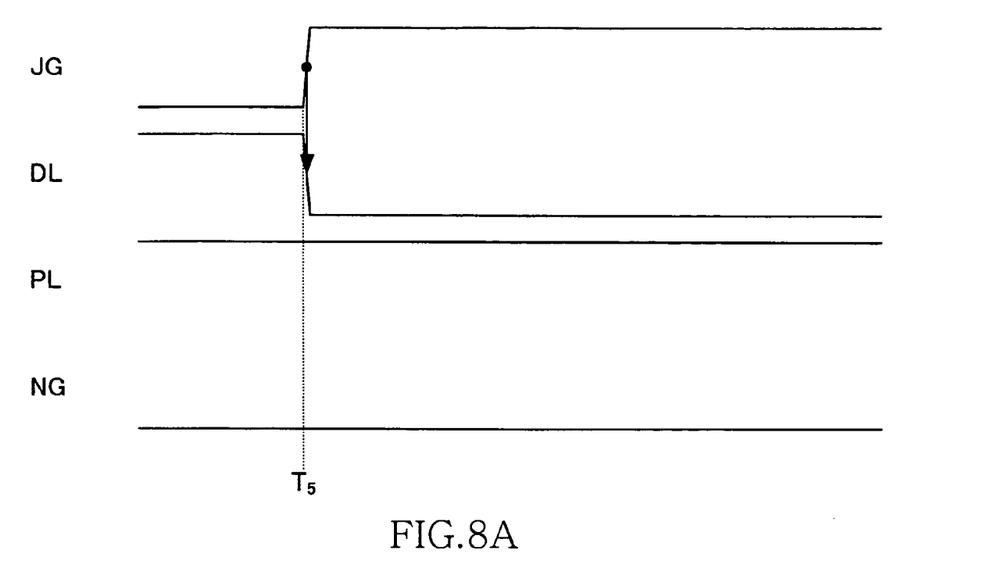
FIG. 8A is a signal timing chart when contents stored in the antifuse element pair match each other for all of the antifuse units included in the defective-address determination circuit according to an embodiment of the present invention.

FIG. 8A is a signal timing chart when the signals En_ExOR and Hit_0_ExOR to Hit_n_ExOR are all at a low level, that is, contents stored in the antifuse element pair 51A and 51B match each other for all of the antifuse units 40 and 41₀ to 41ₙ included in the defective-address determination circuit 30₀.

As shown in FIG. 8A, an output signal NG is at a low level while the test signal JG is at a low level because the precharge line PL is precharged. When the test signal JG becomes a high level at a time T₅, precharging of the precharge line PL is finished and instead the discharge line DL is discharged. However, the precharge line PL maintains the precharged state because all of the transistors 44 and 45₀ to 45ₙ are OFF in the example of FIG. 8A. Therefore, the output signal NG is maintained at a low level. This state is maintained by a transistor 46 and an inverter 48.

Figure 8B:
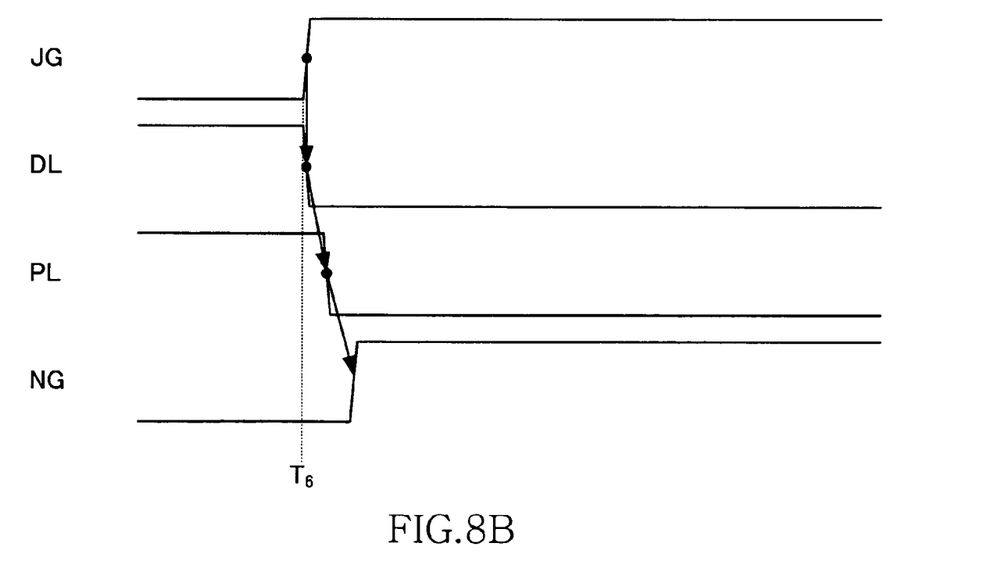
FIG. 8B is a signal timing chart when one or more pairs of antifuse elements having unmatched contents stored therein exist in the defective-address determination circuit according to an embodiment of the present invention.

FIG. 8B is a signal timing chart of a case when at least one of the signals En_ExOR and Hit_0_ExOR to Hit_n_ExOR is at a high level, that is, one or more pairs of antifuse elements 51A and 51B having unmatched contents stored therein exist in the defective-address determination circuit 30₀.

The case of FIG. 8B is similar to FIG. 8A as far as precharging of the precharge line PL is finished and instead the discharge line DL is discharged when the test signal JG becomes a high level at a time T₆.

In the example of FIG. 8B, the potential of the precharge line PL immediately falls to a low level because one of the transistors 44 and 45₀ to 45ₙ is ON and, as shown in FIG. 8B, the output signal NG becomes a high level.

The output signal NG is output via the data input/output terminal DQ to outside. That is, the FIFO circuit 25 switches the input to the output signal NG of the defect determination circuit 33₀ from the read/write bus RWBUS in response to the test signal JG. The FIFO circuit 25 thereby outputs high/low level of the output signal NG via the data input/output terminal DQ to outside.

As described above, the output signal NG of the defect determination circuit 33₀ is activated when pieces of information stored in the pair of antifuse elements 51A and 51B in the defective-address determination circuit 30₀ do not match, that is, when the defective-address determination circuit 30₀ is defective, whereas the output signal NG is deactivated when the defective-address determination circuit 30₀ is non-defective. Therefore, even when only one of the pair of antifuse elements 51A and 51B that stores one-bit information is defective, it is possible to detect the pair as a defective product by referring to the output signal NG.

A manufacturing method of the semiconductor device 10 for discriminating the defective-address determination circuits 30₀ to 30₇ of a defective product using the defect determination circuits 33₀ to 33₇ is explained next.

Figure 9:
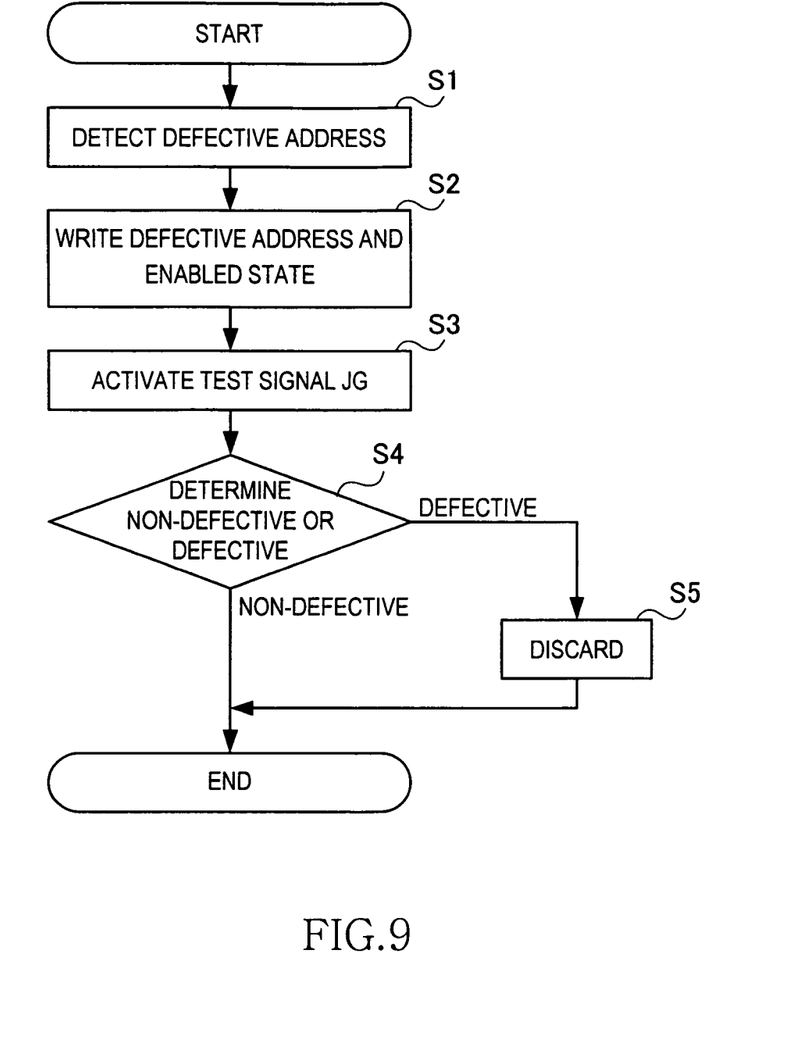
FIG. 9 is a flowchart of a process, among the manufacturing processes of the semiconductor device according to an embodiment of the present invention, which detects the defective-address determination circuits of a defective product.

FIG. 9 is a flowchart of a process, among the manufacturing processes of the semiconductor device 10, which detects the defective-address determination circuits 30₀ to 30₇ of a defective product. This process is performed after packaging. First, as shown in FIG. 9, all of the addresses are read and written to detect a defective address that cannot be read or written (step S1). The detected defective address is then written in corresponding one of the defective-address determination circuits 30₀ to 30₇ (step S2). Specifically, for example, when a defective address is found in the bank #0, a high voltage is applied to each one of the pair of antifuse elements 51A and 51B in the AF units 41₀ to 41ₙ corresponding to a bit "1" of the defective address among the AF units 41₀ to 41ₙ in the defective-address determination circuit 30₀, and the antifuse elements 51A and 51B are changed to a conductive state. Writing of an enabled state in the AF unit 40 is also performed at step S2.

When the writing is finished, the test signal JG is then activated (step S3), and by referring to the output signal NG output as a result from the data input/output terminal DQ (step S4), a determination is made as to whether each of the defective-address determination circuits 30₀ to 30₇ is non-defective or defective. When all of the defective-address determination circuits corresponding to the bank in which a defective address is found are non-defective products, the process is finished. When a defective product is detected, the semiconductor device 10 is discarded (step S6).

As described above, according to the semiconductor device 10, even when only one of the pair of antifuse elements 51A and 51B that stores one-bit information is defective, the pair can be detected as a defective product. Therefore, the defective-address determination circuits 30₀ to 30₇ of a defective product can be discriminated at the manufacturing stage.

It is apparent that the present invention is not limited to the above embodiments, but may be modified and changed without departing from the scope and spirit of the invention.

Figure 10:
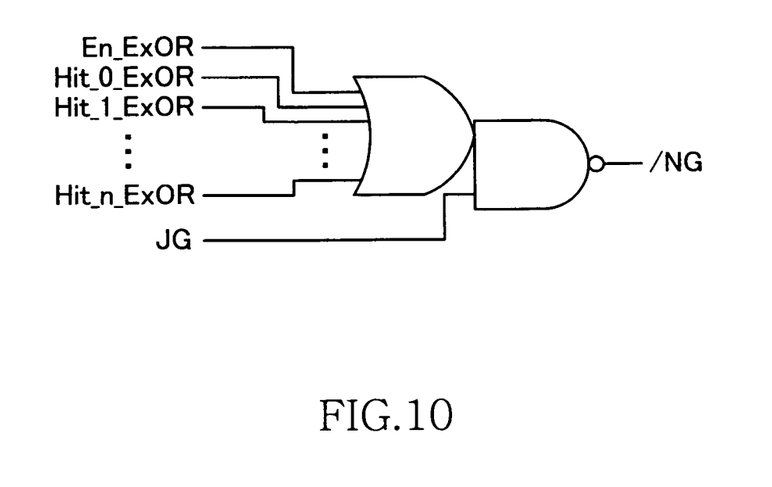
FIG. 10 is a circuit diagram of the defect determination circuit according to a modification of an embodiment of the present invention.

For example, while the circuit shown in FIG. 7 is used as the defect determination circuit 33₀ in the above embodiment, the defect determination circuit 33₀ can be configured using the circuit shown in FIG. 10. That is, as shown in FIG. 10, the signals En_ExOR and Hit_0_ExOR to Hit_n_ExOR can be input to the OR circuit and the NAND of its output and the test signal JG can be used as the output signal /NG. In this case, however, the occupied area is larger than the circuit shown in FIG. 7.

While an example of using an antifuse element has been explained in the above embodiment, the present invention can be applied to other types of nonvolatile elements as far as one-bit information is stored in a pair of nonvolatile elements.

What is claimed is:

1. A semiconductor device comprising:
   first and second fuse elements each representing one of first and second states;
   a first logic circuit coupled to the first and second fuse elements to produce a first logic level when the first fuse element is the same in state as the second fuse element and a second logic level when the first fuse element is different in state from the second fuse element; and
   a second logic circuit coupled to the first and second fuse elements to produce one of the first and second logic levels when at least one of the first and second fuse elements is in the first state and the other of the first and second logic levels when each of the first and second fuse elements is in the second state.

2. The device as claimed in claim 1, further comprising an input node supplied with a signal whose logic level is to be detected and a third logic circuit coupled to the input node and the second logic circuit to detect whether the logic level of the signal is equal to the logic level produced by the second logic circuit.

3. The device as claimed in claim 2, further comprising a plurality of memory cells, the signal being a part of address information for selecting at least one of the memory cells.

4. A semiconductor device comprising:
   first and second fuse elements each representing one of first and second states;
   a first logic circuit coupled to the first and second fuse elements to produce a first logic level when the first fuse element is the same in state as the second fuse element and a second logic level when the first fuse element is different in state from the second fuse element; and
   an internal circuit generating an data signal in a normal operation mode and an output circuit coupled to the internal circuit and the first logic circuit to output the data signal in the normal operation mode and a signal related to the logic level from the first logic circuit in test operation mode.

5. The device as claimed in claim 4, wherein each of the first and second fuse elements may be blown by electrical power.

6. The device as claimed in claim 4, wherein the first logic circuit comprises an Exclusive OR gate.

7. The device as claimed in claim 1, wherein the first logic circuit comprises an Exclusive OR gate and the second logic circuit comprises an OR gate.

8. The device as claimed in claim 2, wherein the first logic circuit comprises an Exclusive OR gate, the second logic circuit comprises an OR gate, and the third logic circuit comprises an Exclusive NOR gate.

9. The device as claimed in claim 4, wherein each of the first and second fuse elements comprises a fuse that is electrically blown, and the fuse is configured such that a current flows therethrough by the fuse being electrically blown.

10. The device as claimed in claim 4, wherein each of the first and second fuse elements comprises an anti-fuse.

11. A semiconductor device comprising:
first and second fuse elements each representing one of first and second states;
a first logic circuit operatively coupled to the first and second fuse elements, the first logic circuit being configured to produce a first logic level when the first fuse element is equal in state to the second fuse element and a second logic level when the first fuse element is different in state from the second fuse element; and
a second logic circuit operatively coupled to the first and second fuse elements, the second logic circuit being configured to produce one of the first and second logic levels when at least one of the first and second fuse elements is in the first state and the other of the first and second logic levels when each of the first and second fuse elements is in the second state.

12. The device as claimed in claim 11, wherein the first logic circuit comprises an Exclusive OR gate, and the second logic circuit comprises an OR gate.

13. The device as claimed in claim 11, further comprising an input node and a third logic, circuit, the input node being supplied with a signal, the third logic circuit being operatively coupled to the input node and the second logic circuit and configured to detect whether the logic level of the signal is equal to the logic level produced by the second logic circuit.

14. The device as claimed in claim 13, wherein the first logic circuit comprises an Exclusive OR gate, the second logic circuit comprises an OR gate, and the third logic circuit comprises an Exclusive NOR gate.

15. The device as claimed in claim 4, further comprising a second logic circuit coupled to the first and second fuse elements to produce one of the first and second logic levels when at least one of the first and second fuse elements is in the first state and the other of the first and second logic levels when both of the first and second fuse elements are in the second state.

16. The device as claimed in claim 15, further comprising an input node supplied with a signal whose logic level is to be detected and a third logic circuit coupled to the input node and the second logic circuit to detect whether the logic level of the signal is equal to the logic level produced by the second logic circuit.

17. The device as claimed in claim 15, wherein the first logic circuit comprises an Exclusive NOR gate and the second logic circuit comprises an OR gate.

18. The device as claimed in claim 16, wherein the first logic circuit comprises an Exclusive Nor gate, the second logic circuit comprises an OR gate, and the third logic circuit comprises an Exclusive NOR gate.

* * * * *